United States Patent
Shilpiekandula et al.

(10) Patent No.: US 8,795,572 B2
(45) Date of Patent: *Aug. 5, 2014

(54) SYMMETRIC THERMOCENTRIC FLEXURE WITH MINIMAL YAW ERROR MOTION

(75) Inventors: Vijay Shilpiekandula, Cambridge, MA (US); Kamal Youcef-Toumi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 699 days.

This patent is subject to a terminal disclaimer.

(21) Appl. No.: 12/425,624

(22) Filed: Apr. 17, 2009

(65) Prior Publication Data

US 2009/0263531 A1 Oct. 22, 2009

Related U.S. Application Data

(60) Provisional application No. 61/045,694, filed on Apr. 17, 2008, provisional application No. 61/049,789, filed on May 2, 2008.

(51) Int. Cl.
  *B29C 59/00* (2006.01)
(52) U.S. Cl.
  USPC .......................................... 264/293; 425/385
(58) Field of Classification Search
  USPC .......................................... 425/385; 264/293
  See application file for complete search history.

(56) References Cited

U.S. PATENT DOCUMENTS

| | | | |
|---|---|---|---|
| 6,696,220 B2 * | 2/2004 | Bailey et al. | 425/385 |
| 6,709,536 B1 | 3/2004 | Kim et al. | |
| 6,864,115 B2 | 3/2005 | Fitzgerald | |
| 7,098,572 B2 * | 8/2006 | Choi et al. | 310/311 |
| 7,238,595 B2 | 7/2007 | Brabant et al. | |
| 7,348,709 B2 | 3/2008 | Xu | |
| 7,789,653 B2 * | 9/2010 | Iimura et al. | 425/385 |
| 8,016,277 B2 * | 9/2011 | Choi et al. | 269/58 |
| 8,033,814 B2 * | 10/2011 | Bailey et al. | 425/385 |
| 8,100,685 B1 * | 1/2012 | Harper et al. | 425/385 |
| 8,210,840 B2 * | 7/2012 | Shilpickandula et al. | 425/385 |
| 8,211,214 B2 * | 7/2012 | Xu et al. | 95/246 |
| 8,282,383 B2 * | 10/2012 | Choi et al. | 425/389 |
| 8,377,349 B2 * | 2/2013 | Sato | 264/40.5 |
| 2004/0028875 A1 | 2/2004 | Van Rijn et al. | |
| 2004/0053146 A1 | 3/2004 | Sreenivasan et al. | |
| 2005/0116370 A1 | 6/2005 | Ogino et al. | |

FOREIGN PATENT DOCUMENTS

JP 2008-504141 2/2008

* cited by examiner

*Primary Examiner* — Dimple Bodawala
*Assistant Examiner* — Emmanuel S Luk
(74) *Attorney, Agent, or Firm* — Gesmer Updegrove LLP

(57) ABSTRACT

A stamping structure for imprinting micro-sized features is provided. The stamping structure includes one or more optical flats. A flexure arrangement includes a plurality of beam flexures arranged in a symmetric configuration around the one or more optical flats so as to minimize the error yaw motion (θz) from thermal fluctuations associated with fixturing the one or more optical flats.

14 Claims, 6 Drawing Sheets

10

| Application | | Pattern transfer via Stamping | Small-scale gaps | Comments |
|---|---|---|---|---|
| Vertical positioning | Range (coarse) | 3 in | 3 in | For sample loading |
| | Range (fine) | 0-400 μm (Closing the gap from a large initial opening) | 100 nm-10 μm (Controlling the gap height to a set value) | Range for stamping includes initial travel and channel depth. |
| | Resolution | ~10 nm | ~nm | Finer resolution required in small-scale gaps to dial in any desired height. |
| | Bandwidth | 100 Hz-1KHz | 100 Hz-1KHz | Faster bandwidth allows for less cycle times |
| Angular (pitch and roll) Alignment | Range (coarse) | 100 mrad | 100 mrad | Use coarse adjustments, for e.g. with spacers. |
| | Range (fine) | 1-5 mrad | 1-5 mrad | |
| | Resolution | ~sub μrad | ~sub μrad | |
| | Bandwidth | 100 Hz-1KHz | 100 Hz-1KHz | Faster bandwidth allows for less cycle times. |
| Load: Force | | 10 kN (5MPa on 75mm x 25mm area) | 0.63 kN (1 MPa on 25 mm x 25 mm area) | Use symmetry, use |
| Load: Thermal | | 200°C | Not significant | Thermal cooling system. |

FIG. 1

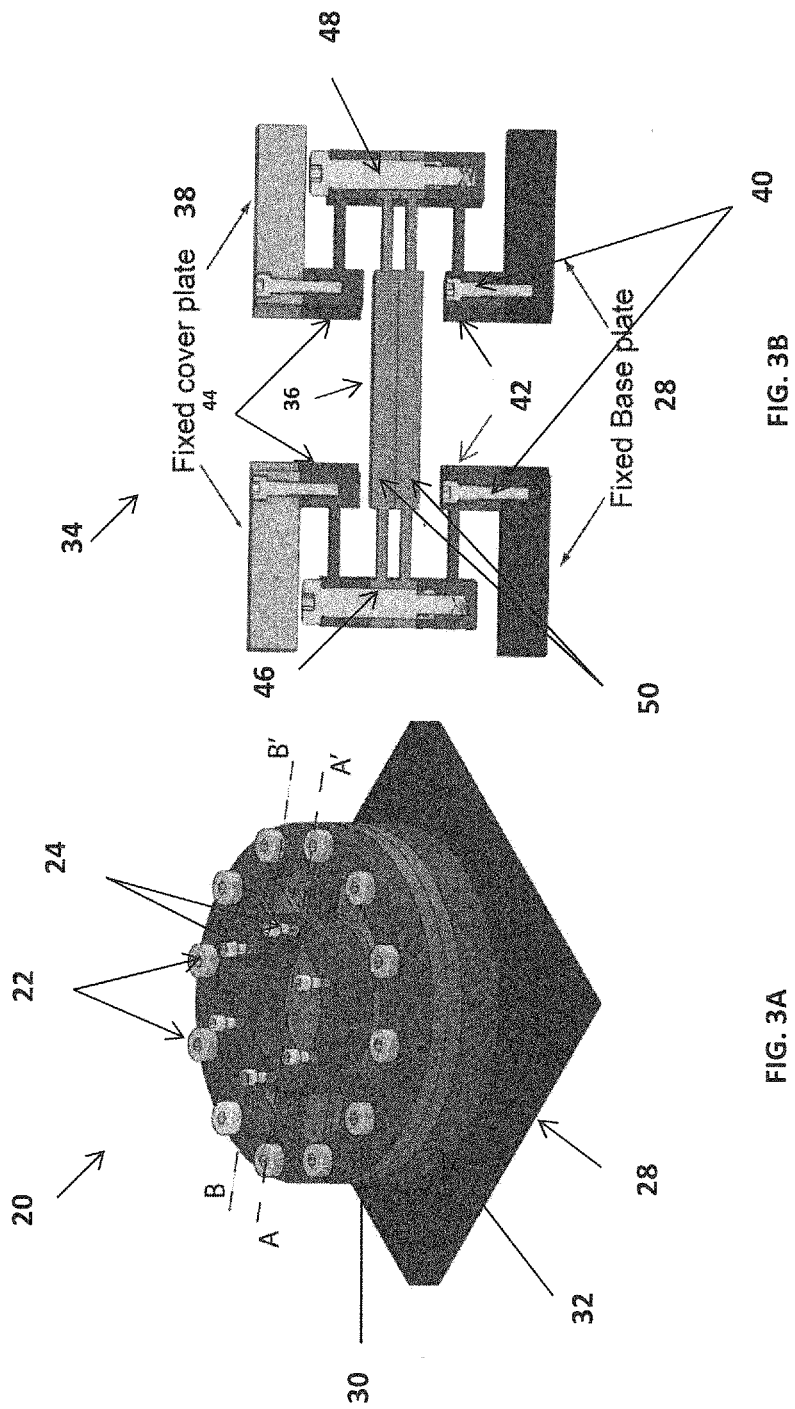

| | Blade Flexure | Parallelogram Flexure | Double Parallelogram flexure |
|---|---|---|---|
| Stiffness | K | K/4 | K/22.6 |
| Vertical Range | $\delta$ | $4\delta$ | $22.6\delta$ |

FIG. 5

SYMMETRIC THERMOCENTRIC FLEXURE WITH MINIMAL YAW ERROR MOTION

PRIORITY INFORMATION

This application claims priority from provisional application Ser. No. 61/045,694 filed on Apr. 17, 2008, and provisional application Ser. No. 61/049,789 filed on May 2, 2008, both of which are incorporated herein by reference in their entireties.

BACKGROUND OF THE INVENTION

The invention is related to the field of optomechanical systems and nanomanufacturing, and in particular to symmetric thermocentric flexures with minimal yaw error motion.

Distortion-free fixturing of optical flats is critical to many micro/nano manufacturing applications. Optical flats are used, for example, as a rigid backing for stamps or polymer parts in microcontact printing and nano-imprint lithography. Other uses are in programmable small-scale gap applications, such as those involving stamping of DNA patterns assembled on one optical flat to another flat positioned in close proximity.

Optical flats are made usually from fused silica or quartz, which have a coefficient of thermal expansion on the order of 0:5 ppm/K. The surface finish for the flats is marked by Ra roughness values on the order of 1 nm, and deviations from surface planarity are typically limited to about 30 nm or less. A mismatch in the thermal coefficients of expansion of such flats and the rest of the supporting structure (made usually from metal) may result in surface distortions and warping, and hence, poor pattern replication from the stamp to the part.

SUMMARY OF THE INVENTION

According to one aspect of the invention, there is provided a stamping structure for imprinting micro-sized features. The stamping structure includes one or more optical flats. A flexure arrangement includes a plurality of beam flexures arranged in a symmetric configuration around the one or more optical flats so as to minimize the error yaw motion ($\theta z$) from thermal fluctuations associated with fixturing the one or more optical flats.

According to another aspect of the invention, there is provided a method of forming a stamping structure for imprinting micro-sized features. The method includes providing one or more optical flats. Also, the method includes arranging in a symmetric fashion around the one or more optical flat structures a plurality of beam flexures so as to minimize the error yaw motion ($\theta z$) from thermal fluctuations associated with fixturing the one or more optical flats.

BRIEF DESCRIPTION OF THE DRAWINGS

FIG. 1 is a table illustrating functional requirements for precision positioning and alignment for stamping and small-scale gap applications;

FIG. 3A is schematic diagram illustrating the inventive flexure-based arrangement and FIG. 3B is a schematic diagram illustrating a cross-sectional view of the flexure-based arrangement;

FIG. 5 is a table illustrating stiffness and range comparison when designed for the same load-capacity.

DETAILED DESCRIPTION OF THE INVENTION

The invention provides a design and control of flexure-based mechanisms for positioning/fixturing and angular alignment for (i) pattern transfer via stamping and (ii) small-scale gap applications in micro/nanomanufacturing. As will be explained hereinafter, existing designs do not address some critical functional requirements identified for the applications of interest. The invention works toward new concepts and designs that one can implement and test.

The invention focuses in positioning and aligning a tool and sample, or two optical flats, in their degrees of freedom (DOF) (z vertical, $\theta_x$ pitch and $\theta_y$ roll) while satisfying the following functional requirements given in Table 10 of FIG. 1. The constrained motions are x (lateral), y (lateral), and $\theta_z$ (yaw). Moreover, the invention uses parallel kinematics with actuator isolation, minimal cross-axis motion errors (e.g. errors in $\theta x$ or $\theta y$ when z is actuated), and minimal parasitic error motions (e.g. errors in x when z is actuated).

Figure 2:
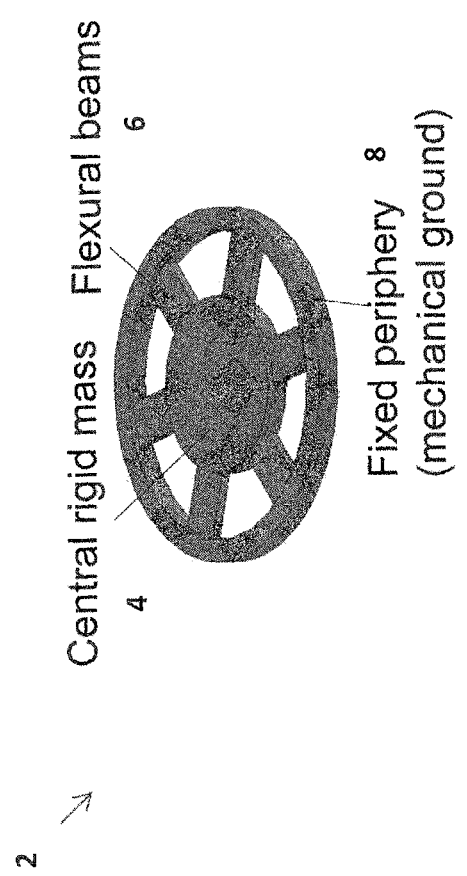
FIG. 2 is schematic diagram illustrating a diaphragm flexure allowing for three degrees of freedom (DOF) for a tool or sample fixed to its central rigid mass.

Precise vertical guidance and angular alignment between the tool and sample, or between two optical flats, can be achieved by using flexure-based mechanisms since they ensure smooth elastic motion without friction or backlash. One such mechanism is the diaphragm flexure mechanism 2, shown schematically in a radial beam configuration in FIG. 2. In particular, FIG. 2 shows a diaphragm flexure arrangement 2 allowing for three DOF for a tool or sample fixed to its central rigid mass 4 using a fixed periphery 8. The DOFs are deflection (perpendicular to the plane of the mass), and pitch and roll (about any two perpendicular axes in the plane of the mass). A diaphragm flexure 2 with radially oriented beams 6 is shown; the concepts presented here apply to diaphragm flexures composed of tangential or curved beams as well.

However, existing diaphragm flexure designs cannot meet the stringent load requirements of about 10 kN specified for micro-hot-embossing. Increasing the thickness of the flexural beams 6 can help improving the maximum load that can be sustained before failure. However, the increase in beam thickness comes with an increase in stiffness and a decrease in the overall deflection possible with the mechanism. Low deflections indicate limited range of travel and hence the depths of microfluidic channels embossed into the polymer in a micro-hot-embossing process. On the other hand, without increasing the beam thickness, it is possible to improve on the load capacity and stiffness through the design described below.

A schematic diagram of the inventive diaphragm flexure arrangement 20 is shown in FIG. 3A. This diaphragm flexure arrangement 20 includes a stack of diaphragm flexure structure 34 formed in a double-parallelogram flexure configuration 36 revolved about the central axis. A head-on view of the volume slice AA'B'B is shown FIG. 3B. Note FIG. 3B show a single diaphragm flexure structure but the diaphragm flexure arrangement 20 includes a plurality of such diaphragm flexure structures 34. Also, for purposes of clarity FIG. 3A does not show a cover layer 38.

The inventive diaphragm flexure arrangement 20 can be designed, for example, to position and align a sample in a micro-hot-embossing setup. When a tool guided, for example by a hydraulic press, comes into contact with the sample, the sample will conform to the tool orientation during the embossing due to the inherent pitch and roll compliance of the mechanism. For the same load-capacity this mechanism is expected to have a larger range (vertical deflection and in turn, pitch and roll angular deflection) than a conventional diaphragm flexure.

A fixed base plate 28 and cover plate 40 can be fastened to the frame of the vertical press (e.g. an Instron press) to form a rigid structural ground using fasteners 22, 24. Also, fasteners 40 are used to couple the fixed base plate 28 to the diaphragm flexure structure 34. The diaphragm flexure structure 34 includes a number of rigid structures 42, 44 used to provide angular and vertical positioning to a double-parallelogram flexure configuration 36 having one or more flexure blades 50. The rigid structures 42, 44 and double-parallelogram flexure configuration 36 are coupled to supporting structures 46, 48 used in properly positioning the inventive flexure arrangement 20.

The effect of misalignments in the cover plate and any stresses induced in the flexural beams during abrasive waterjet machining and subsequent assembly can be studied experimentally by monitoring the free response of the diaphragm with an interferometric displacement sensor. A liquid thermal cooling system can be included with an existing embossing setup on which this mechanism is being tested allows for preventing build up of large thermal (axial) stresses in the flexural mechanism.

The flexure arrangement 20 provides guidance and/or angular alignment without any friction, hysteresis, or creep non-linearities. The supporting structures 46, 48 can be coupled to one or more actuators for passive, semi-passive, or active techniques for guidance and/or angular alignment. The flexure arrangement 20 allows achieving parallelism between a tool and a sample. Also, the diaphragm flexure structure 34 can be arranged in a series or parallel or hybrid configuration so as to manage load-capacity while still achieving adequate vertical and angular range of a sample used by the stamping structure.

Figure 4A:
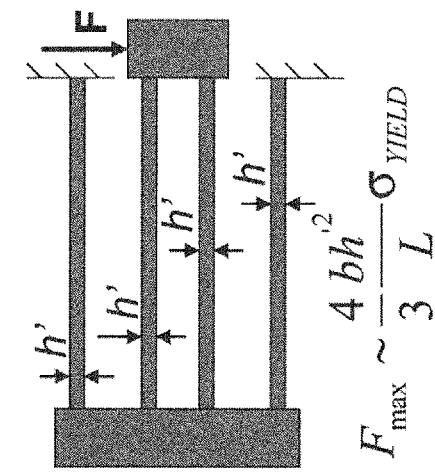
FIG. 4A-4C are schematic diagrams illustrating a blade flexure, a parallelogram or a double blade flexure, and a double-parallelogram flexure.
Figure 4B:
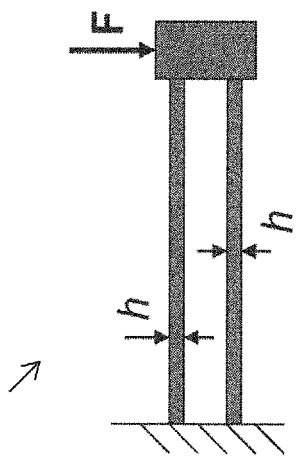
Figure 4C:
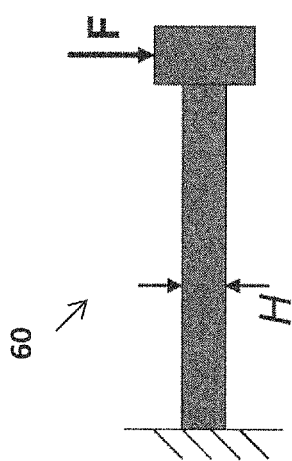

The use of a double parallelogram flexure as a constituent block in this design is based on a comparison between a simple blade flexure, a double blade flexure, and a double parallelogram flexure presented in FIGS. 4A-4C. FIG. 4A shows a blade flexure 60, FIG. 4B shows a parallelogram or double blade flexure 62, and FIG. 4C shows a double-parallelogram flexure 64. For these flexures, load capacities $F_{max}$ for each case is given in terms of width b into the plane of the page, the length L, and thicknesses H, h, and h', respectively. For the same load capacity, the double parallelogram flexure 64 has the largest range (deflection).

For small deflections, one can develop lumped models using linear Euler-Bernoulli beam bending theory to estimate the load capacity, vertical deflection, and stiffness. The stiffness and vertical deflection (range) values for the three flexures 60, 62, 64 of FIGS. 4A-4B when designed for the same load capacity are given in Table 66 of FIG. 5.

The double parallelogram flexure 64 has the largest vertical deflection of the three flexures and is hence desirable. Since the inventive flexure arrangement is built based on the double parallelogram flexure, one can expect that it has about 20 times larger vertical (and angular) range as compared to the diaphragm flexure 2 of FIG. 2 designed to sustain the same load.

The invention can be used for both passive and actively controlled implementations that need vertical guidance and angular alignment. The invention can be used in fabricating and testing the flexure-based mechanism for use in passive alignment with a low-cost high-production micro-hot-embossing setup. In this setup, a pressurized air gun is used as the vertical actuator to which the tool is attached. The sample is mounted on the proposed design, which occupies a footprint circle of 8-inch diameter. By the rule of reciprocity, an equally acceptable arrangement is one with the tool supported on the flexure and pushing into a polymer sample fixed to a rigid ground. The error motions (parasitic) from this structure are expected to be low since the stiffness ratios for in-plane motion to out-of-plane motion are on the order of $(L/h')^2$ where h' is the beam thickness and L its length. An added benefit to the design is its modularity; stiffness or load-capacity can be tuned based on the number of beam layers included in the stack.

The following discussion is on active feedback control implementations around the proposed mechanism. Since the mechanism is designed to have parallel kinematics, three linear actuators, arranged in a non-collinear configuration, can be used to push down on the central rigid mass to actuate the 3 DOFs—vertical motion, pitch, and roll. In some embossing machines that are already provided with a vertical actuator, such as an Instron press, active feedback control of angular alignment can be achieved with actuators placed horizontally (orthogonal to the vertical load, and hence not in the load path). The horizontally placed actuators can push on a lever arm rigidly attached to the central rigid mass, causing it rotate from the generated moment. The longer the lever arm, the larger is the moment generated for a relatively smaller force. The limitation of this design is the increased inertia from having a lever arm and the resulting reduction in bandwidth. Design tradeoffs such as that between bandwidth and range need to be hence addressed in the implementation, based on the requirements of the end-application.

As for sensing, capacitive sensors that measure the displacement of the lever arm may be used in initial trials for feedback control. These sensors will be collocated with the piezoelectric actuators. The absolute reference or "zero reading" needed for the capacitive sensors can be obtained when the tool and sample are brought into complete contact with a preset amount of "over travel". This technique seems promising, but it is limited by the surface finish characteristics of the tool and sample since the zero reading is uncertain by the amount $\Delta S/L$, where $\Delta S$ is the uncertainty in surface planarity and L is the lateral span of the mating surfaces. On the other hand, using the end-point feedback i.e. direct gap measurement with an optical sensor, such as a multiple-beam interferometer, may perform better in correcting for any angular misalignment errors. However, the resulting non-collocated arrangement is likely to pose heavy challenges on controller design.

Distortion-free fixturing of optical flats is critical to many micro/nanomanufacturing applications. Optical flats are used, for example, as a rigid backing for stamps or polymer parts in micro-contact printing and nano-imprint lithography. Other uses are in the small-scale gap applications, such as those involving stamping of DNA patterns assembled on one optical flat to another flat positioned in close proximity. Any thermal mismatch in the coefficients of expansion of the flats and the rest of the supporting structure (made usually from metal) can result in surface distortions and warping, and hence, poor pattern replication from the stamp to the part.

Existing designs are not adequate for distortion and error-free fixturing. Commonly used fixtures for holding a circular optical flat implement three tangential constraints via blade flexures, oriented along the sides of an equilateral triangle circumscribing the circular profile of the flat. Each blade flexure is grounded at the vertex of the equilateral triangle and connected on the other end to the point of tangency to the circular flat. Irrespective of the mismatch between the coefficients of thermal expansion (CTE) of the components, this design allows for distortion-free radial expansion (or contraction) of the flat under any random ambient thermal fluctuations. However, owing to the length variation of each of the blade flexures under random thermal fluctuations, the design has a random error yaw motion, which is hard to correct. As an order of magnitude estimate, an uniform ±1K temperature change for an aluminum blade flexure of length L and coefficient of thermal expansion (CTE) of 25 ppm/K holding an optical flat of radius R, the yaw error is approximately given by $L*CTE*\Delta T/R$, which can be on the order of ±25 microradians. Such an error motion may compromise the resolution in printing applications, or induce undesirable physics in small-scale gap applications.

The invention is a symmetric arrangement of the tangential constraint on each side of the equilateral triangle for minimizing the undesired yaw motion from thermal fluctuations. A similar idea of using symmetry for minimizing error yaw motions is discussed in a different context: for diaphragm flexure designs subject to out-of-plane mechanical loading.

A symmetric fixed-fixed beam arrangement is first considered, which is over-constrained and results in high radial stiffness. As an improvement, the invention uses symmetric arrangements using double parallelogram flexural units. Two topologies are considered for these arrangements—rectilinear and circular. The folded beam structure used in these configurations may be appropriately designed to cause adequate radial compliance, allowing for distortion-free expansion of the optical flat, while also ensuring minimal yaw motion.

Figure 6A:
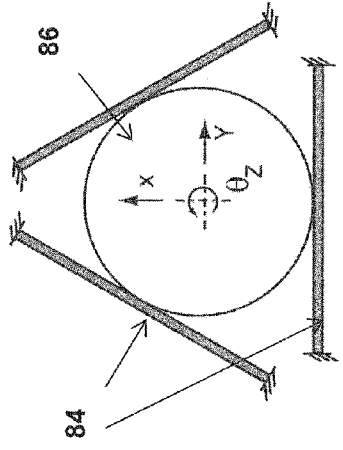
FIGS. 6A-6C are schematic diagrams illustrating embodiments used to address symmetric thermocentric flexures with minimal yaw error motion.
Figure 6B:
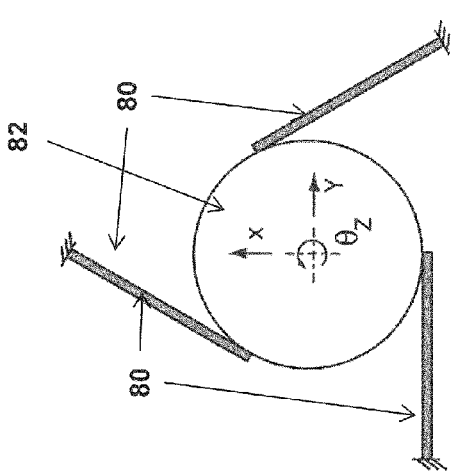
Figure 6C:
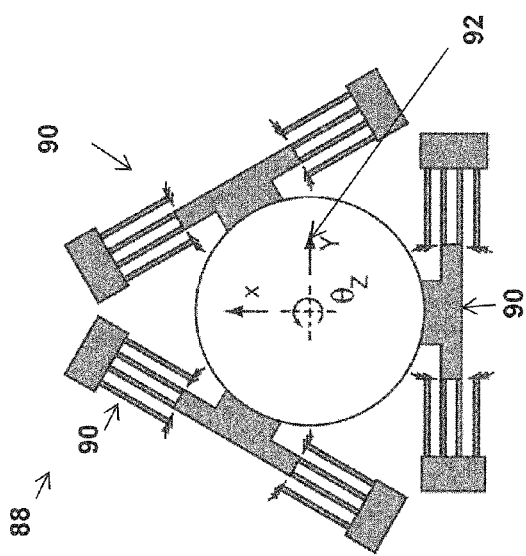

FIG. 6A shows a three blade flexures 80 fixed to a circular mirror-like surface or optical flat structure 82 providing three tangential constraints. This design has an inherent yaw error motion that can affect resolution in stamping applications or induce undesirable physics. FIG. 6B shows a symmetric arrangement with fixed-fixed beam flexures 84 being radially stiff and can curb free thermal expansion, causing out-of-plane warping on the optical flat structure 86. FIG. 6C shows symmetric flexural arrangement 88 using double parallelogram flexures 90. Owing to symmetry, the error yaw motion θz of an optical flat 92 from thermal fluctuations is expected to be minimized with these designs. The radial compliance is increased, thus allowing for free thermal expansions. Another configuration with circular-arc (instead of straight) double parallelogram flexures 90 can also be considered and compared with this design for maximum radial compliance possible within a given footprint.

With this design for fixturing the optical flats, a flexure-based designs such as that shown in FIGS. 3A-3B and FIGS. 4A-4C can be incorporated with the flexures 90 of FIG. 6C to achieve precise vertical positioning and angular alignment as well as distortion and error-free thermal expansion of the flat.

The invention addresses the need for precision angular alignment between two surfaces, either a stamping tool and a polymer sample, or two rigid optical flats in the areas of micro and nanomanufacturing. Unlike existing small-scale gaps, the invention focuses in achieving precise parallelism in a plane-on-plane geometry. While diaphragm flexures have been used extensively in prior art, the invention provide a new design for a flexural mechanism that offers about 20 times larger vertical (and angular) deflection than a conventional diaphragm flexure. Also, the inventive a design can ensure thermocentricity without error motions in fixturing optical flats.

Although the present invention has been shown and described with respect to several preferred embodiments thereof, various changes, omissions and additions to the form and detail thereof, may be made therein, without departing from the spirit and scope of the invention.

What is claimed is:

1. A stamping structure for imprinting micro-sized features comprising:
   one or more optical flats; and
   a flexure arrangement having a plurality of double parallelogram beam flexures arranged in a symmetric configuration around said one or more optical flats so as to minimize the error yaw motion (θz) from thermal fluctuations associated with fixturing said one or more optical flats so as to allow for increased radial compliance, said double parallelogram beam flexures allow for precise plane-on-plane parallelism, said double parallelogram beam flexures revolve about a central axis where said arrangement includes a plurality of rigid structures to provide angular and vertical positioning.

2. The stamping structure of claim 1, wherein said flexure arrangement provides guidance and/or angular alignment without any friction, hysteresis, or creep non-linearities.

3. The stamping structure of claim 1, wherein said flexure arrangement is coupled to one or more actuators for passive, semi-passive, or active techniques for guidance and/or angular alignment.

4. The stamping structure of claim 1, wherein said flexure arrangement is coupled to one or more sensors for semi-passive or active semi-passive or active techniques for guidance and/or angular alignment.

5. The stamping structure of claim 1, wherein said double parallelogram beam flexures comprise double-parallelogram flexures.

6. The stamping structure of claim 1, wherein said double parallelogram beam flexures comprise parallelogram or double blade flexures.

7. The stamping structure of claim 1, wherein said flexure arrangement achieving parallelism between said stamping structure and an item.

8. A method of forming a stamping structure for imprinting micro-sized features comprising:
   providing one or more optical flats; and
   arranging in a symmetric fashion around said one or more optical flats a plurality of double parallelogram beam flexures so as to minimize the error yaw motion (θz) from thermal fluctuations associated with fixturing said one or more optical flats so as to allow for increased radial compliance, the double parallelogram beam flexures allow for precise plane-on-plane parallelism, said double parallelogram beam flexures revolve about a central axis where said arrangement includes a plurality of rigid structures to provide angular and vertical positioning.

9. The method of claim 8, wherein said double parallelogram beam flexures provide guidance and/or angular alignment without any friction, hysteresis, or creep non-linearities.

10. The method of claim 8, wherein said double parallelogram beam flexures are coupled to one or more actuators for passive, semi-passive, or active techniques for guidance and/or angular alignment.

11. The method of claim 8, wherein said double parallelogram beam flexures are coupled to one or more sensors for semi-passive or active semi-passive or active techniques for guidance and/or angular alignment.

12. The method of claim 8, wherein said double parallelogram beam flexures comprise double-parallelogram flexures.

13. The method of claim 8, wherein said double parallelogram beam flexures comprise parallelogram or double blade flexures or single blade flexures.

14. The method of claim 8, wherein said double parallelogram beam flexures achieving parallelism between said stamping structure and an item.

* * * * *